US009863059B2

(12) United States Patent
Sudo et al.

(10) Patent No.: US 9,863,059 B2
(45) Date of Patent: Jan. 9, 2018

(54) METHOD FOR PULLING SILICON SINGLE CRYSTAL

(71) Applicant: SUMCO CORPORATION, Minato-ku, Tokyo (JP)

(72) Inventors: Toshiaki Sudo, Akita (JP); Tadahiro Sato, Akita (JP); Ken Kitahara, Akita (JP); Eriko Kitahara, Akita (JP)

(73) Assignee: SUMCO CORPORATION, Tokyo (JP)

(*) Notice: Subject to any disclaimer, the term of this patent is extended or adjusted under 35 U.S.C. 154(b) by 73 days.

(21) Appl. No.: 14/901,017

(22) PCT Filed: Jun. 29, 2013

(86) PCT No.: PCT/JP2013/067945
§ 371 (c)(1),
(2) Date: Dec. 22, 2015

(87) PCT Pub. No.: WO2014/207942
PCT Pub. Date: Dec. 31, 2014

(65) Prior Publication Data
US 2016/0153116 A1 Jun. 2, 2016

(51) Int. Cl.
*C30B 15/10* (2006.01)
*C30B 29/06* (2006.01)

(52) U.S. Cl.
CPC .............. *C30B 15/10* (2013.01); *C30B 29/06* (2013.01)

(58) Field of Classification Search
CPC ................................ C30B 15/00; C30B 15/10
See application file for complete search history.

(56) References Cited

U.S. PATENT DOCUMENTS 7,716,948 B2 * 5/2010 Kemmochi ........... C03B 19/095 117/200
8,361,228 B2 * 1/2013 Kemmochi ........... C03B 19/095 117/200
9,216,923 B2 * 12/2015 Kemmochi ........... C03B 19/095
2009/0308307 A1 12/2009 Hirose et al.
2010/0186662 A1 * 7/2010 Kemmochi ........... C03B 19/095 117/208

(Continued)

FOREIGN PATENT DOCUMENTS

JP 04198084 A 7/1992
JP 2003267781 A 9/2003

(Continued)

OTHER PUBLICATIONS

International Search Report (ISR) dated Aug. 13, 2013, issued for International application No. PCT/JP2013/067945.

*Primary Examiner* — Robert M Kunemund
(74) *Attorney, Agent, or Firm* — Law Office of Katsuhiro Arai

(57) ABSTRACT

A method for pulling silicon single crystal includes a process of placing a molded body between a susceptor's inner surface and a crucible's outer surface. The molded body is formed based on three-dimensional data of the inner surface shape of the susceptor which can hold the vitreous silica crucible and three-dimensional data of the crucible so as to make the susceptor's central axis and the crucible's central axis substantially aligned when it is placed between the susceptor's inner surface and the crucible's outer surface.

5 Claims, 5 Drawing Sheets

(56) References Cited

U.S. PATENT DOCUMENTS

| | | | | |
|---|---|---|---|---|
| 2013/0025319 | A1* | 1/2013 | Kemmochi | C03B 19/095 65/17.3 |
| 2014/0326172 | A1 | 11/2014 | Sudo et al. | |

FOREIGN PATENT DOCUMENTS

| | | | |
|---|---|---|---|
| JP | 2013139356 | A | 7/2013 |
| WO | 2008007637 | A1 | 1/2008 |
| WO | 2013094318 | A1 | 6/2013 |

* cited by examiner

[Fig.1]
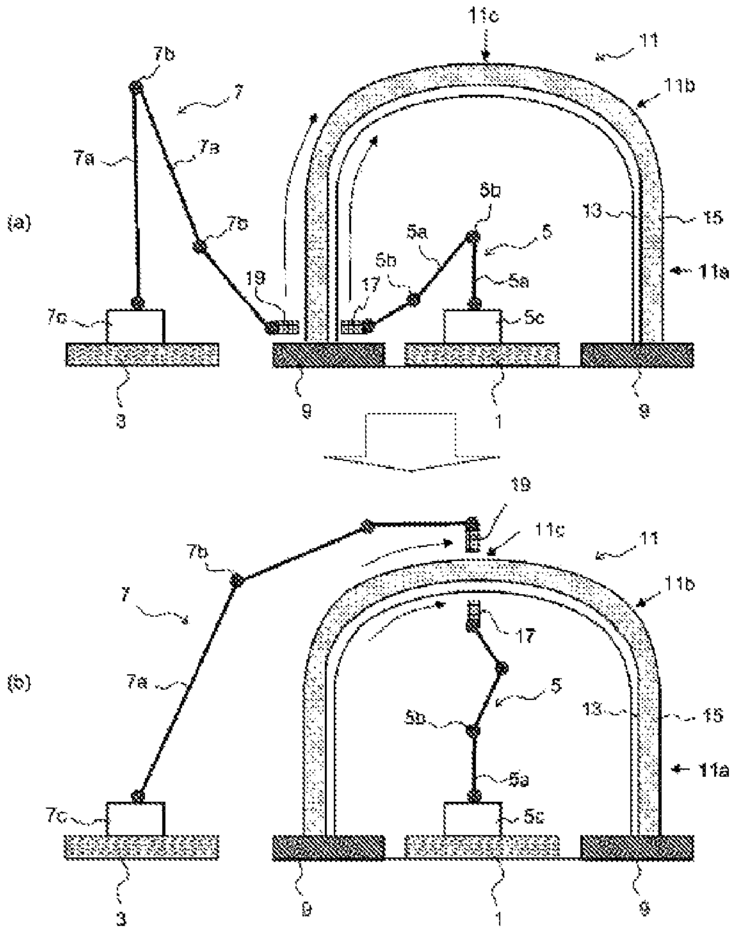
[Fig.2]
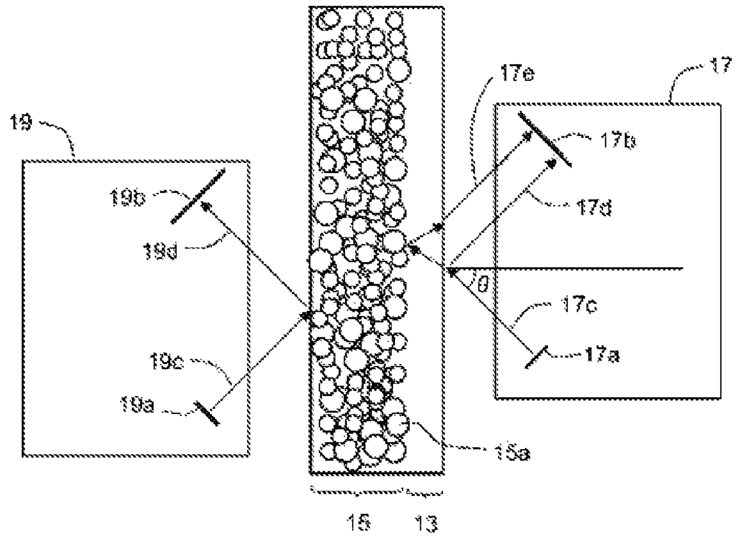

[Fig.3]
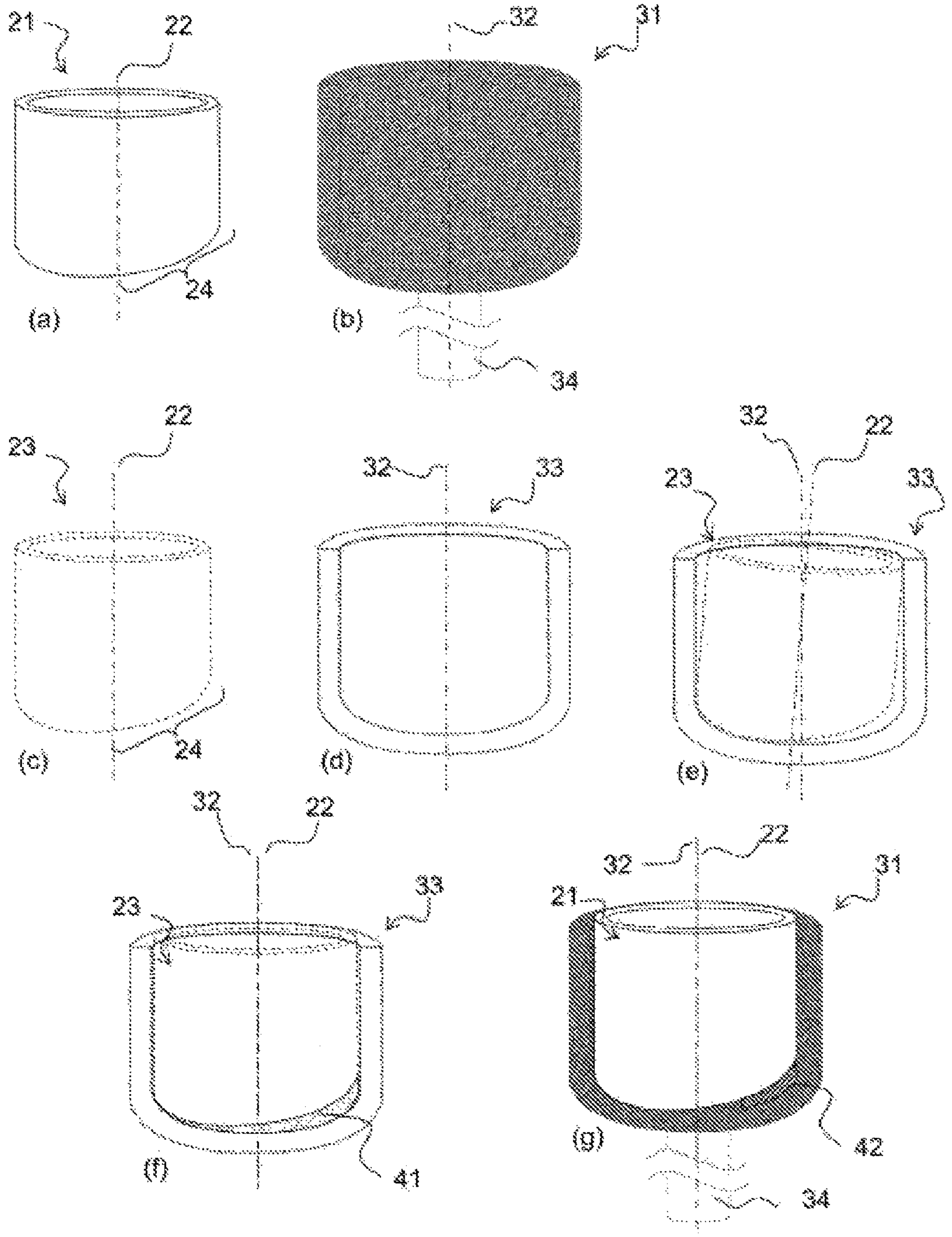

[Fig.4]
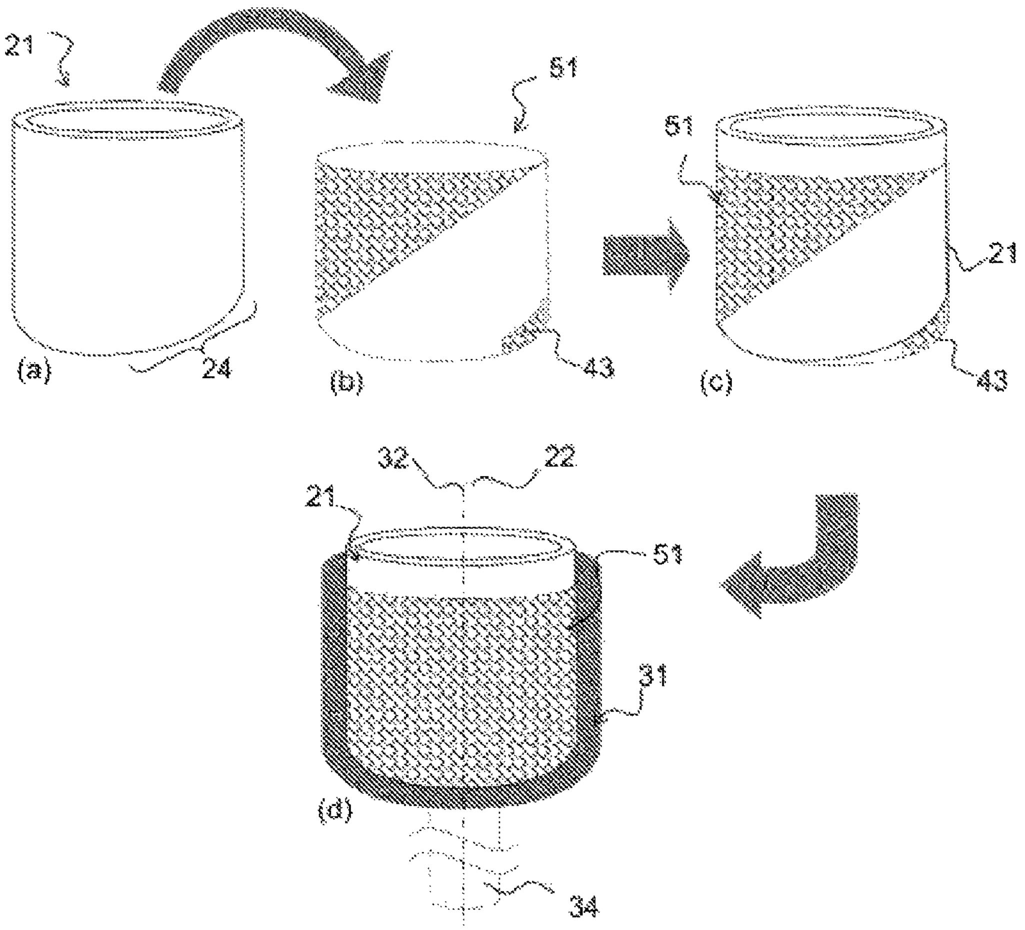

[Fig.5]
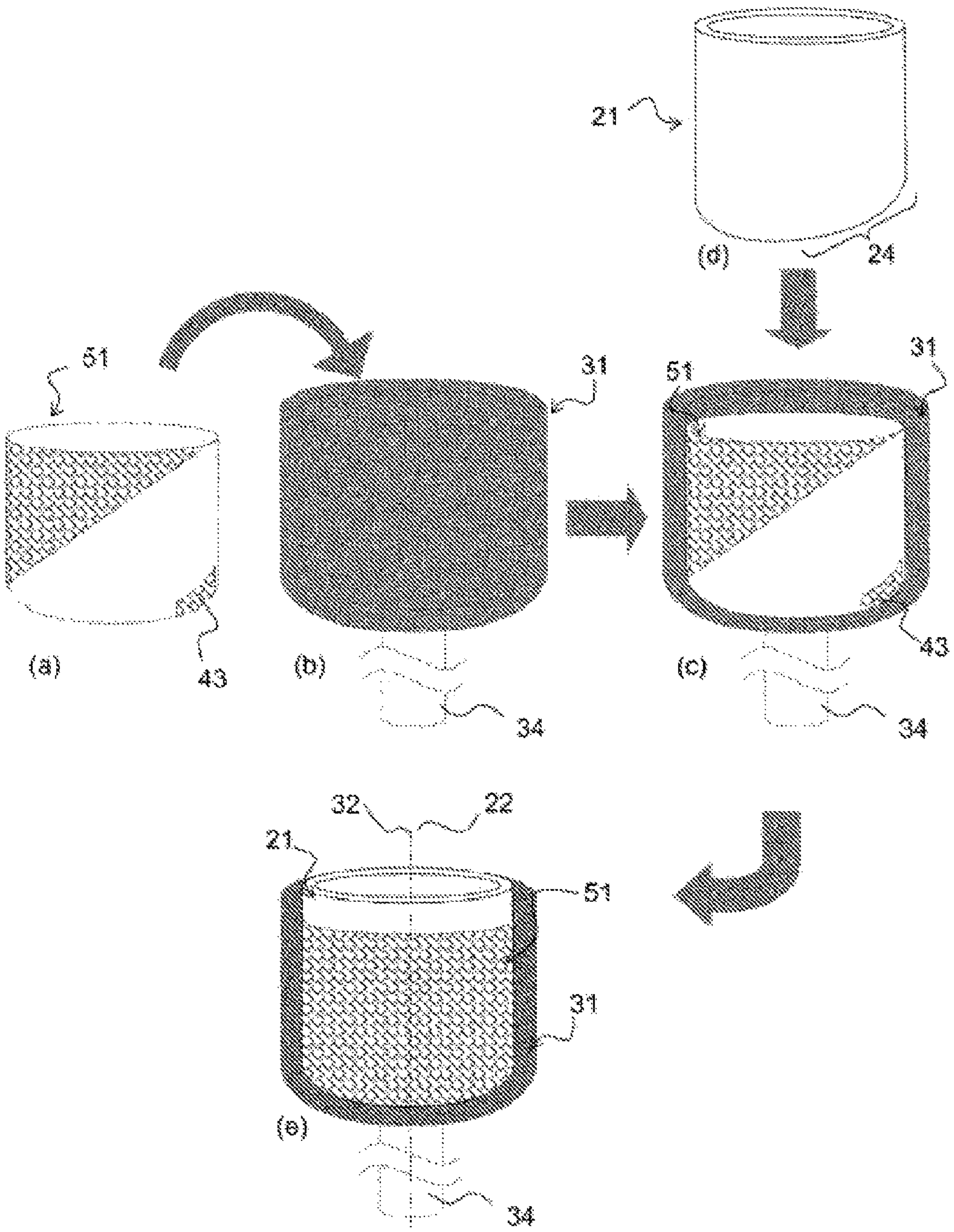

[Fig.6]
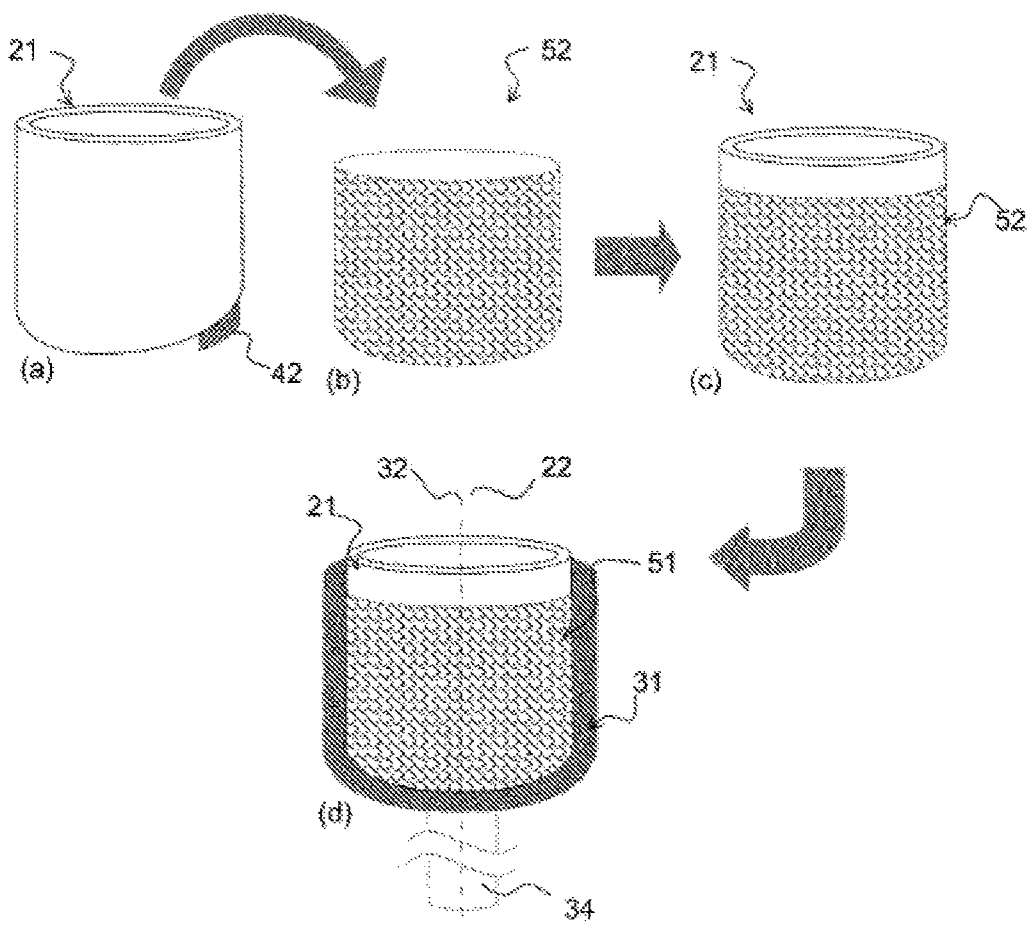

METHOD FOR PULLING SILICON SINGLE CRYSTAL

TECHNICAL FIELD

The present invention relates to a method for pulling silicon single crystal.

BACKGROUND ART

A vitreous silica crucible is used during the manufacturing process of silicon single crystal by the Czochralski method. A polysilicon is put into the vitreous silica crucible and then is heated, so the highly purified polysilicon is melted and a silicon melt is obtained. While rotating a susceptor that holds the vitreous silica crucible, an end portion of a seed crystal is immersed into the silicon melt, and is pulled up while being rotated so as to produce the silicon single crystal. In order to keep the solid-liquid interface at the central part of the silicon melt's surface which allows the silicon melt to contact the silicon single crystal at approximately 1420° C. which is the melt point of silicon, the temperature of the vitreous silica crucible is controlled at a relatively high level with a range of 1450-1600° C. In a pulling-up process of the silicon single crystal which may last more than two weeks, sometimes the extent of sidewall sagging deformation at the rim portion of the vitreous silica crucible may be 5 cm and greater.

Silicon single crystal used as semiconductor material is produced by the Czochralski method, by which polysilicon is heated up to approximately 1450-1500° C. inside a vitreous silica crucible and then is pulled up. Because flash memory and DRAM are expected to rapidly have lower prices and higher performance, in order to meet such requirement, the diameter of the silicon single crystal is changing from 300 mmΦ which is mainly used currently to a larger size with a range of 400-450 mmΦ. In accordance with this situation, in order to produce silicon single crystal with a larger diameter, the diameter of a vitreous silica crucible's opening portion is also changing from 600 mm to a larger size of 1000 mm or more. As the diameter of the vitreous silica crucible's opening portion is becoming larger, accordingly the distance between the heater, which is disposed outside the vitreous silica crucible, and the center of the silicon single crystal is also becoming greater than before. For example, if the diameter of an opening portion is changed from 600 mm to 1000 mm, the distance between the heater and the center of the silicon single crystal will be 200 mm and greater. In addition, the quantity of the silicon melt at approximately 1450-1500° C. will also become larger along with increasing of the diameter of the vitreous silica crucible's opening portion. A crucible with a diameter of about 1000 mm has a weight of approximately 120 kg which is quite heavy for a person to move it by hand, and the weight of silicon melt contained in it is 900 kg and more. In other words, when the silicon single crystal is being pulled up, silicon melt with a temperature of around 1500° C. and a weight of 900 kg or more will be contained in the crucible.

As a result, the distance between the central axis of the susceptor and the rim area of the vitreous silica crucible will become greater. Therefore, a deviation between the central axis of the susceptor and the central axis of the vitreous silica crucible can no longer be ignored because problems start to occur in the pulling-up process of the singles crystal silicon. For example, when an angle is formed between the central axis of the susceptor and the vitreous silica crucible or a deviation appears between the parallel central axis of both of them, a turbulent flow will occur inside the silicon melt and then it will be more difficult to attach the seed crystal to the melt, resulting in a low single-crystal yield of silicon ingot.

SUMMARY OF THE INVENTION

Problems to be Solved

However, conventionally, relying on the past experience, the alignment between the central axes of the vitreous silica crucible and the susceptor is carried out in a CZ furnace manually. In order to avoid damage to the vitreous silica crucible, after it is mounted into the susceptor, usually the vitreous silica crucible is not moved. Even in the case that it can be moved, it is still a very time-consuming task to take the fragile vitreous silica crucible from the susceptor carefully. Especially, in recent years since alarge-diameter vitreous silica crucible always has a weight of 100 kg or more, it has been very difficult to move the vitreous silica crucible and then to re-adjust the central axis after mounting the vitreous silica crucible into the susceptor.

In addition, when using the large-diameter vitreous silica crucible to carry out the pulling-up of silicon single crystal, it takes more time than does using the traditional vitreous silica crucible, and the time spent heating the vitreous silica crucible also becomes longer. As a result of lengthy heating, deformation of the vitreous silica crucible will be caused, such as inward sagging or buckling, which eventually creates an adverse effect on the pulling-up of the silicon single crystal. In order to avoid the deformation of the vitreous silica crucible, the deformation of the crucible can be prevented by installing a carbon sheet material onto the outer surface of the vitreous silica crucible. Due to the thickness of the carbon sheet material, the gap between the vitreous silica crucible and the susceptor can be filled, so it becomes more difficult to move the vitreous silica crucible after it is inserted into the susceptor.

In consideration of such circumstances, without adjusting the central axes of the susceptor and the vitreous silica crucible, the present invention provides a method for pulling silicon single crystal to make the central axes aligned each other substantially only by placement between the inner surface of the susceptor and the outer surface of the vitreous silica crucible.

Solution to Solve the Problems

In order to solve the above problem, the present invention provides a following method for pulling silicon single crystal. More specifically, the present invention provides a method for pulling silicon single crystal that includes a process of placing a molded body between a susceptor's inner surface and a crucible's outer surface, wherein the molded body is formed based on three-dimensional data of inner surface shape of the susceptor which can hold the vitreous silica crucible and three-dimensional data of the crucible so as to make the susceptor's central axis and the crucible's central axis substantially aligned when it is placed between the susceptor's inner surface and the crucible's outer surface.

Since the alignment between the central axes of the susceptor and the crucible is carried out relying on the past experience, a method for aligning the central axes in an easy and reliable way has not yet been under discussion. The present inventors considered that the central axes can be aligned each other through filling all the gaps between the susceptor and the vitreous silica crucible by placing a carbon sheet on the outer surface of the vitreous silica crucible. However, the central axes were not aligned even if all the gaps had been filled.

When the present inventors pursued further analysis, it was discovered that variability occurs in every single three-dimensional shape of each vitreous silica crucible's outer surface, which was produced by using a rotating mold method. Natural silica powder is supplied into a rotating mold, which is used as a crucible mold, and then synthetic silica powder is supplied onto the natural silica powder. By melting the silicon powder through Joule heat generated from arc discharge, a vitreous silica crucible is produced, which has an inner surface layer (synthetic layer) vitrified from synthetic silica powder and an outer surface layer (natural layer) vitrified from natural silica powder. Variability is considered to occur in the three-dimensional shape of crucibles as the shapes of the molds, which are used as crucible molds, may not always be the same due to abrasion, and the melting temperature and ambient temperature are also non-constant due to continuous production and other related reasons.

Moreover, it became unraveled that variability also occurs in the three-dimensional shape of the inner surface of the susceptor. Especially for the susceptor, it was also discovered that the three-dimensional shape of the inner surface changes slightly after each pulling-up of silicon single crystal. According to these analyses, it was discovered that the nonalignment of the central axes of the susceptor and the crucible was caused by the mismatch of the three-dimensional shape of the susceptor's inner surface and the three-dimensional shape of the crucible's outer surface. However, it was difficult at the manufacturing stage to match with the three-dimensional shape of susceptor's inner surface when manufacturing the vitreous silica crucible. Especially, because the inner surface shape of the susceptor is different before and after the pulling-up of the silicon single crystal, it becomes more difficult to match it with the outer surface shape of the vitreous silica crucible.

The results indicate that the central axes of the vitreous silica crucible and the susceptor cannot be aligned only by placing a carbon sheet material on the vitreous silica crucible just to fill the gap.

As a result of the above analysis, the present invention has achieved aligning the central axes each other substantially by placing a molded body formed in consideration of the three-dimensional shapes of the vitreous silica crucible's outer surface and the susceptor's inner surface, between the outer surface of the crucible and the inner surface of the susceptor. According to this structure, it is possible to provide a method for pulling silicon single crystal which can make the central axes match each other substantially only by placing a molded body between the outer surface of the vitreous silica crucible and the inner surface of the susceptor, with no need of adjusting the central axes of the vitreous silica crucible and the susceptor.

More specifically, although the method for aligning the central axes of the susceptor and the vitreous silica crucible to a same axis line was previously unknown except for adjusting them empirically, since the central axes of the susceptor and the vitreous silica crucible can be aligned to a same axis line without relying on empirical methods, according to the above-mentioned method mistakes arising from inserting the vitreous silica crucible into the susceptor can be reduced, the seed crystal can be attached to silicon melt smoothly, and single-crystal yield of silicon ingot can be improved, which make it possible to supply silicon wafers at a stable price.

BRIEF DESCRIPTION OF THE DRAWINGS

FIG. 1 is an explanatory drawing of the three-dimensional shape-measuring method for the vitreous silica crucible according to an embodiment of the present invention.

FIG. 2 is an enlarged view of the Internal-distance measurement unit and the vitreous silica crucible next to it as shown in FIG. 1.

FIG. 3 is an explanatory drawing of the process through which the central axis of the vitreous silica crucible and the central axis of the susceptor are matched by using a molded body corresponding to the gap, based on the measurement result of the three-dimensional shapes of the vitreous silica crucible and the susceptor.

FIG. 4 is an explanatory drawing of the process through which the central axis of the vitreous silica crucible and the central axis of the susceptor are matched by mounting the crucible into the above-mentioned molded body that covers the outer surface of the sidewall portion of the crucible, and then mounting the crucible covered by the molded body into the susceptor, in which the molded body is used to fill up the gap occurring when the vitreous silica crucible is mounted into the susceptor. The molded bodies shown in FIG. 4(*b*) and (*c*) are partial cross-sectional views for the purpose of illustration.

FIG. 5 is an explanatory drawing of the process through which the central axis of the vitreous silica crucible and the central axis of the susceptor are matched by placing the above-mentioned molded body that covers the outer surface of the sidewall portion of the crucible onto the susceptor, and then mounting the vitreous silica crucible into the susceptor provided with the above-mentioned molded body, in which molded body is used to fill up the gap occurring when the vitreous silica crucible is mounted into the susceptor. The molded bodies shown in FIG. 5(*b*) and (*c*) are partial cross-sectional views for the purpose of illustration.

FIG. 6 is an explanatory drawing of process through which the central axis of the vitreous silica crucible and the central axis of the susceptor are matched by mounting the vitreous silica crucible equipped with the molded body into a sheet or a cloth-shaped molded body, and then mounting them into the susceptor.

DESCRIPTION OF THE EMBODIMENTS

The present embodiment provides a method for pulling silicon single crystal which comprises a process of placing a molded body between the inner surface of the susceptor and the outer surface of the crucible; the molded body is placed between the inner surface of the susceptor and the outer surface of the crucible based on the three-dimensional data of the inner surface shape of the susceptor which is capable of holding the vitreous silica crucible and the three-dimensional data of the crucible so as to be to make the central axis of the susceptor and central axis of the crucible aligned substantially. A detail of each constituent element is described below.

<Vitreous Silica Crucible>

As the object to be measured, vitreous silica crucible 11 has a transparent vitreous silica layer 13 in the inner surface side and a vitreous silica layer 15 which contains bubbles in the outer surface side, and it is located on a rotatable rotation platform 9 which allows the opening portion of the vitreous silica crucible 11 to face downward. The vitreous silica crucible 11 comprises a corner portion 11*b* which has a relatively large curvature; a cylindrical sidewall portion 11*a* which has an edge portion opening portion at an upper surface; and a cone-shaped bottom portion 11*c* which has straight lines or curves with relatively small curvature. In the present invention, the corner portion is a portion which connects the sidewall portion 11*a* and the bottom portion 11*c*, which is equivalent to a portion starting from the point where a tangent line of the corner portion's curve overlaps with the sidewall portion 11*a* of the vitreous silica crucible and ending at the point where there is a common tangent line with the bottom portion 11*c*. In other words, a bend-beginning point on the sidewall portion 11*a* of the vitreous silica crucible 11 is the boundary between the sidewall portion 11*a* and the corner portion 11*b*. Furthermore, the portion with a constant curvature on the bottom of the crucible is the bottom portion 11*c*, and the point where the curvature starts to change when the distance from the center of the bottom of the crucible begins to increase is the boundary between the bottom portion 11*c* and the corner portion 11*b*.

<Internal Robot Arm, Internal-Distance Measurement Unit>

An internal robot arm 5 is installed on a base 1 which is disposed at a portion covered by the crucible 11. The internal robot arm 5 comprises a plurality of arms 5*a*, a plurality of joints 5*b* rotatably supporting these arms 5*a*, and a body portion 5*c*. An external terminal (not shown) is disposed on the body portion 5*c* to enable data exchange with the outside. An internal-distance measurement unit 17 is disposed on the tip of the internal robot arm 5 to measure the inner surface shape of the crucible 11. The internal-distance measurement unit 17 measures the distance between the Internal-distance measurement unit 17 and the inner surface of the crucible 11 by detecting the light reflected from the inner surface of the crucible 11 which is generated by irradiating a laser beam to the inner surface. A control unit is disposed inside the body portion 5*c* to control the joints 5*b* and internal-distance measurement unit 17. The control unit makes the internal-distance measurement unit 17 move to any three-dimensional position by moving the arm 5 through the rotation of the joints 5*b* on the basis of an external input signal or program which was set in the body portion 5*c*. Specifically, the internal-distance measurement unit 17 is driven to move along the inner surface of the crucible with no contact. Accordingly, the control unit is provided with rough shape data of the crucible's inner surface, and moves the position of the Internal-distance measurement unit 17 in accordance to the data. More specifically, for example, the measurement starts from a position close to the opening portion of the crucible 11 as illustrated in FIG. 1(*a*), and then as illustrated in FIG. 1(*b*), the internal-distance measurement unit 17 is driven to move towards the bottom portion 11*c* of the crucible 11 and measures at a plurality of measurement points along the movement path. The measurement interval for example is 1-5 mm and alternatively is 2 mm. The measurement can be conducted at a timing pre-stored in the internal-distance measurement unit 17, or can be conducted according to an external trigger. The measurement results are stored in the storage unit inside the internal-distance measurement unit 17, and then sent to the body portion 5*c* collectively after the measurement or sent to the body portion 5*c* sequentially for each measurement. The internal-distance measurement unit 17 may also be controlled by a control unit disposed separately from the body portion 5*c*.

When the measurement from the opening portion to the bottom portion 11*c* of the crucible is finished, the same measurement can be carried out after a slight rotation of the rotation platform 9. This measurement can be conducted from the bottom portion 11*c* towards the opening portion. The rotation angle of the rotation platform 9 is determined in consideration of accuracy and measurement time, for example in a range of 2-10 angular degrees, The measurement accuracy may be insufficient if the rotation angle is too large, while the measurement may take too much time if the rotation angle is too small. The rotation of the rotation platform 9 is controlled based on an external input signal or an internally stored program. The rotation angle of the rotation platform 9 can be detected through a rotary encoder or the like. The rotation of the rotation platform 9 preferably moves inter-connectedly with the movement of the internal-distance measurement unit 17 and the external-distance measurement unit 19 which will be discussed below, as a result, it is easy to calculate the three-dimensional coordinates of the internal-distance measurement unit 17 and the external-distance measurement unit 19.

As will be described below, the internal-distance measurement unit 17 can measure both the distance from the internal-distance measurement unit 17 to the inner surface (inner surface distance), and the distance from the internal-distance measurement unit 17 to the interface between the bubble-containing layer 15 and the transparent layer 13 (interface distance). The angle of the joint 5*b* can be obtained by a rotary encoder or the like which is disposed on the joint 5*b*. Since the three-dimensional coordinates and direction of the position of the internal-distance measurement unit 17 at each measurement point can be obtained, if the inner surface distance and the interface distance can be calculated, the three-dimensional coordinates at the inner surface and the three-dimensional coordinates at the interface can be obtained. And, since the measurement from the opening portion to the bottom portion 11*c* of the crucible 11 is conducted on the entire circumference of the crucible 11, the three-dimensional shape of the inner surface of the crucible 11 and the three-dimensional shape of the interface can be obtained. In addition, since the distance between the interface and the inner surface can be obtained, the thickness of the transparent layer 13 can also be obtained, and the three-dimensional distribution of the thickness of the transparent layer can also be calculated.

<External Robot Arm, External-Distance Measurement Unit>

An external robot arm 7 is installed on a base 3 which is disposed outside of the crucible 11. The external robot arm 7 includes: a plurality of arms 7*a*, a plurality of joints 7*b* rotatably supporting these arms, and a body portion 7*c*. An external terminal (not shown) is disposed on the body portion 7*c* to enable data exchange with the outside. An external-distance measurement unit 19 is disposed on the tip of the external robot arm 7 which measures the outer surface shape of the crucible 11. The external-distance measurement unit 19 irradiates a laser beam to the outer surface of the crucible 11, and measures the distance from the external-distance measurement unit 19 to the outer surface of crucible 11 by detecting the light reflected from the outer surface. A control unit is disposed inside the body portion 7*c* to control the joints 7*b* and the external-distance measurement unit 19. The control unit makes the external-distance measurement unit 19 move to any three-dimensional position by moving the arm 7 through the rotation of the joints 7*b* on the basis of an external input signal or program which was set in the body portion 7*c*. Specifically, the external-distance measurement unit 19 is driven to move along the crucible's outer surface with no contact. Accordingly, the control unit is provided with rough shape data of the crucible's outer surface and moves the external-distance measurement unit 19 according to the data. More specifically, for example, the measurement starts from a position close to the opening portion of the crucible 11 as shown in FIG. 1(*a*), and then as illustrated in FIG. 1(*b*), the external-distance measurement unit 19 is driven to move towards the bottom portion 11*c* of the crucible 11 and measures at a plurality of measurement points along a movement path. The measurement interval, for example, is 1-5 mm, and alternatively is 2 mm. The measurement can be conducted at a timing pre-stored in the external-distance measurement unit 19, or can be conducted according to an external trigger. The measurement results are stored in the storage unit inside the external-distance measurement unit 19, and then sent to the body portion 7*c* collectively after the measurement or sent to the body portion 7*c* sequentially for each measurement. The external-distance measurement unit 19 may also be controlled by a control unit disposed separately from the body portion 7*c*.

The internal-distance measurement unit 17 and the external-distance measurement unit 19 may move synchronously but the measurement of the inner surface shape and the measurement of the outer surface shape do not need to be synchronous because they are conducted independently.

The external-distance measurement unit 19 is able to measure the distance from the external-distance measurement unit 19 to the outer surface (outer surface distance). An angle of the joints 7*b* may be obtained by a rotary encoder disposed on the joints 7*b*, and three-dimensional coordinates and a direction of the position of the external-distance measurement unit 19 can also be obtained. Therefore, three-dimensional coordinates at the outer surface can be obtained by calculating the outer surface distance. In addition, the measurement from the opening portion of crucible 11 to the bottom 11*c* is conducted over the entire circumference of the crucible 11 so it is possible to obtain a three-dimensional shape of the outer surface of crucible 11.

Above all, since the three-dimensional shape of the crucible's inner surface and outer surface can be obtained, it is also possible to calculate a three-dimensional distribution of the crucible's wall thickness.

<Detail of Distance Measurement>

Next, the distance measurement is described in detail by means of the internal-distance measurement unit 17 and the external-distance measurement unit 19 referring to FIG. 2.

As shown in FIG. 2, the internal-distance measurement unit 17 is disposed on the inner surface side of crucible 11 (the side of transparent vitreous silica layer 13), and the external-distance measurement unit 19 is disposed on the outer surface side of crucible 11 (the side of vitreous silica layer 15 which contains bubbles). The internal-distance measurement unit 17 includes an emission unit 17*a* and a detection unit 17*b*. The external-distance measurement unit 19 includes an emission unit 19*a* and a detection unit 19*b*. Also, the internal-distance measurement unit 17 and the external-distance measurement unit 19 include a control unit and an external terminal (not shown). The emission units 17*a* and 19*a* are laser beam emitters such as semiconductor lasers. The wavelength of the emitted laser beam is not especially limited but it is alternatively a red laser beam of 600-700 nm wavelength. The detection units 17*b* and 19*b* for example are CCDs, which determines the distance to the target based on the position where the light reaches according to a principle of triangulation method.

Of the laser beam emitted from the emission unit 17*a* of the internal-distance measurement unit 17, one part is reflected at the inner surface (the surface of the transparent vitreous silica layer 13) and the other part is reflected at an interface between the transparent vitreous silica layer 13 and the vitreous silica layer 15 which contains bubbles. These reflected lights (inner surface reflection light or interface reflection light) reach detection unit 17*b* and are detected. As can be seen from FIG. 2, the inner surface reflection light and the interface reflection light reach different positions of the detection unit 17*b*. By the difference in the positions, the distance (inner surface distance) from the internal-distance measurement unit 17 to the inner surface and the distance (interface distance) to the interface are determined respectively. A preferable incidence angle θ may be changed according to the status of the inner surface, the thickness of transparent vitreous silica layer 13, and the status of vitreous silica layer 15 containing bubbles, which may be 30-60 angular degrees for example.

<Susceptor>

When pulling a silicon single crystal, it is possible to measure the three-dimensional shape of the susceptor's inner surface holding the vitreous silica crucible according to the same principle as the above method.

<Molded Body>

When it is placed between the susceptor's inner surface and the crucible's outer surface based on the three-dimensional data of the inner surface shape of the susceptor which can hold the vitreous silica crucible and the three-dimensional data of the crucible, the molded body will be formed so that the susceptor's central axis is substantially aligned with the crucible's central axis.

The molded body's position and/or shape may be calculated according to the susceptor's inner surface and the vitreous silica crucible's inner surface as well as the outer surface's three-dimensional shape data so as make each central axis become aligned. Here, the vitreous silica crucible's central axis is substantially parallel to the inner surface of the crucible's sidewall portion and passes through the center of the opening portion. In some cases, the crucible's outer surface and inner surface are not parallel with each other so a central axis on the basis of the inner surface is preferable. This is because the crucible together with the susceptor generally reversely rotates with respect to silicon single crystal, which disturbs the surface of the silicon melt due to eccentricity of the crucible's inner surface. The central axis of the susceptor passes through in a substantially vertical direction so as to make the susceptor rotate in a horizontal direction. Accordingly, since the crucible's inner surface is substantially parallel to the susceptor's central axis, if the susceptor's central axis is substantially vertical with respect to the horizontal plane, the crucible's inner surface will also become vertical with respect to the horizontal plane and the surface of the silicon melt and the inner surface of the crucible will become vertical, which can prevent the melt surface from being disturbed.

The molded body may not cover all of the susceptor's inner surface or the crucible's outer surface. It may have a shape covering part of the crucible's outer surface or the susceptor's inner surface. For example, it may be a shape covering the vitreous silica crucible's bottom portion, the corner portion, and part of the sidewall portion as well as the bottom portion and the corner portion. In addition, it may be a shape only covering the crucible's bottom portion. This is because the molded body may engender a high cost if the shape covers all of the crucible's outer surface or the susceptor's inner surface. The molded body covering the crucible's outer surface or the susceptor's inner surface may be a shape having a thickness which can be changed to match with the susceptor's inner surface and the vitreous silica crucible's inner surface as well as the outer surface's three-dimensional shape instead of having a uniform thickness. Additionally, there may be a plurality of molded bodies. Under such circumstance, each molded body may be placed on the crucible's outer surface or the susceptor's inner surface at a position where the central axes of each other are aligned. In the case of placing the molded body between the crucible's outer surface and the susceptor's inner surface, as long as the central axes of each other are aligned, it is allowable for a gap to exist between the crucible's outer surface and the susceptor's inner surface. In addition, it is allowable to mount a related vitreous silica crucible onto the susceptor after placing part of the molded body onto the susceptor's inner surface in advance and then placing the remaining part of the molded body onto the crucible's outer surface.

<Shape and Material of Molded Body>

The method of processing a molded body is not especially limited but it is possible to adopt a cut-out method by using machinery such as NC machinery. This is advantageous because it can be processed by using the data of three-dimensional shapes. In addition, it is also possible to laminate plate-shaped, sheet-shaped, or cloth-shaped molded bodies to form a molded body, which is advantageous to fill a partial gap. In addition, it is also possible to combine the cut-out molded body and the laminated molded body for use. Furthermore, the cut-out molded body and/or the laminated molded body placed on the crucible's outer surface may be covered by a sheet-shaped or cloth-shaped molded body, and may also be covered by knitting fiber. The same thing can apply to the case of placement on the susceptor's inner surface. The sheet or the cloth after covering may be hardened by a heating or chemical treatment. The material of the molded body is not especially limited but may be heat-resistant material. Since the pulling of silicon single crystal is performed under a high temperature condition of about 1450-1600° C., if the molded body is not formed by heat-resistant material, during the pulling of single crystal, the shape of the molded body will be destroyed and the central axis will be offset. In addition, the heat-resistant material may be carbon. Carbon is preferable because this material may also be used for the susceptor and has excellent heat resistance. Furthermore, it is possible to use carbon material or ceramics or a combination of these.

<Configuration 1 of Molded Body>

For the present embodiment, the configuration of the molded body is described in detail referring to FIG. 3. FIG. 3(*a*) shows a vitreous silica crucible 21 having a deformed portion 24 from the crucible's bottom portion to the corner portion. FIG. 3(*b*) shows a cross-sectional view of the susceptor 31 and the rotation axis 34. The vitreous silica crucible's three-dimensional shape 23 (FIG. 3(*c*)) and the susceptor's inner surface three-dimensional shape 33 (FIG. 3(*d*)) are measured according to the above measuring method. When inserting the vitreous silica crucible's three-dimensional shape 23 into the susceptor's inner surface three-dimensional shape 33 based on the data measured, as shown in FIG. 3(*e*), it is apparent that the vitreous silica crucible's central axis 22 and the susceptor's central axis 32 are not aligned. As shown in FIG. 3(*f*), when moving the vitreous silica crucible's three-dimensional shape 23 so as to make the central axis 22 and the central axis 32 aligned, there appears a gap 41 between the crucible's bottom portion and the susceptor. A molded body 42 with the central axis 22 and the central axis 23 aligned is formed. As shown in FIG. 3(*g*), by placing the molded body 42 between the vitreous silica crucible 21 and the susceptor 31, the central axis 22 and the central axis 32 can be aligned. By placing the molded body in advance, the vitreous silica crucible can be mounted to the susceptor with no need of adjusting the central axes.

In addition, as shown in FIG. 4, the molded body may be a molded body 51 (FIG. 4(*b*)) covering part of the vitreous silica crucible. Incidentally, the molded body 51 shown in FIGS. 4(*b*) and (*c*) is a partial cross-sectional view for illustrative purposes. The molded body 43 located in the deformed portion 24 is integrated with the molded body 51. By mounting the vitreous silica crucible 21 to the molded body 51 and mounting the vitreous silica crucible 21 which is mounted to the molded body 51 to the susceptor 31, the central axis 22 and the central axis 32 can be aligned. By covering the vitreous silica crucible with the molded body which can make the central axis 22 and the central axis 32 aligned in advance, when used, the vitreous silica crucible can be inserted into the susceptor with no need of the process of placing molded body and the process of adjusting central axes.

In addition, as shown in FIG. 5, the molded body may also be a molded body 51 (FIG. 5(*a*)) covering the susceptor's inner surface. Incidentally, the molded body 51 shown in FIG. 5(*a*) and (*c*) is a partial cross-sectional view for illustrative purposes. The molded body 43 corresponding to the deformed portion 24 is integrated with the molded body 51. By placing the molded body 51 onto the susceptor 31 and mounting the vitreous silica crucible 21 onto the susceptor 31 which is provided with the molded body 51, the central axis 22 and the central axis 32 can be aligned. By covering the susceptor's inner surface with molded bodies to fill gaps in advance, when used, the vitreous silica crucible can be mounted into the susceptor with no need of the process of placing molded body and the process of adjusting central axes.

<Configuration 2 of Molded Body>

For another embodiment, configuration of molded body is described in detail referring to FIG. 6. In FIG. 6(*a*), a molded body 42 is installed onto the vitreous silica crucible 21. The molded body 42 is made from carbon. The vitreous silica crucible 21 installed with the molded body 42 is mounted into a sheet-shaped molded body 52 which is fabricated based on the vitreous silica crucible's three-dimensional shape 23 and the susceptor's inner surface three-dimensional shape 33 so as to prevent position offset between the vitreous silica crucible 21 and the molded body 42 before being mounted into the susceptor 31. By mounting the vitreous silica crucible 21 covered by the sheet-shaped molded body 52 and the molded body 42 into the susceptor 31, the central axis 22 and the central axis 32 can be aligned.

The invention claimed is:

1. A method for pulling silicon single crystal comprising:

a process of placing a molded body between a susceptor's inner surface and a crucible's outer surface;

wherein the molded body is formed based on three-dimensional data of the inner surface shape of the susceptor which can hold the vitreous silica crucible and three-dimensional data of the crucible so as to make the susceptor's central axis and the crucible's central axis substantially aligned when it is placed between the susceptor's inner surface and the crucible's outer surface; and a process of producing silicon single crystal by the Czochralski method, wherein the crucible is filled with a polysilicon and heated to melt the polysilicon to obtain a silicon melt, followed by pulling silicon single crystal from the silicon melt.

2. The method according to claim 1, wherein the central axis of the crucible is made parallel to an inner surface of the crucible's sidewall portion and passes through the opening portion's center.

3. The method according to claim 1, wherein the molded body does not cover all of the susceptor's inner surface or the crucible's outer surface.

4. The method according to claim 1, wherein the molded body is made from heat-resistant material.

5. The method according to claim 4, wherein the heat-resistant material is carbon.

* * * * *